United States Patent [19]
Karasawa

[11] Patent Number: 5,436,917
[45] Date of Patent: Jul. 25, 1995

[54] DATA PROCESSING APPARATUS HAVING ERROR DETECTION/CORRECTION CODES

[75] Inventor: Katsumi Karasawa, Kawasaki, Japan

[73] Assignee: Canon Kabushiki Kaisha, Tokyo, Japan

[21] Appl. No.: 55,358

[22] Filed: May 3, 1993

[30] Foreign Application Priority Data

May 18, 1992 [JP] Japan .................................. 4-125033
May 18, 1992 [JP] Japan .................................. 4-125034

[51] Int. Cl.6 ........................................... G06F 11/10
[52] U.S. Cl. .................................. 371/37.4; 371/5.5; 371/37.5
[58] Field of Search .................. 371/37.4, 37.5, 37.7, 371/5.1-5.5, 49.1-49.4, 50.1, 51.1

[56] References Cited

U.S. PATENT DOCUMENTS

| | | | |
|---|---|---|---|
| 4,541,091 | 9/1985 | Nishida et al. | 371/37.5 |
| 4,748,628 | 5/1988 | Moriwaki | 371/37.5 X |
| 4,782,490 | 11/1988 | Tenengolts | 371/37.5 |
| 4,792,953 | 12/1988 | Pasdera et al. | 371/31 |
| 4,796,261 | 1/1989 | Moriwaki | 371/37.4 |
| 4,943,964 | 7/1990 | Hatanaka et al. | 371/37.4 X |
| 4,972,417 | 11/1990 | Sako et al. | 371/37.4 |
| 5,068,857 | 11/1991 | Yoshida | 371/37.4 X |
| 5,200,961 | 4/1993 | Karasawa et al. | 371/37.1 |
| 5,247,579 | 9/1993 | Hardwick et al. | 371/39.1 X |

FOREIGN PATENT DOCUMENTS

| | | |
|---|---|---|
| 0402115 | 12/1990 | European Pat. Off. . |
| 0411835 | 2/1991 | European Pat. Off. . |
| 0461787 | 12/1991 | European Pat. Off. . |
| 59-135941 | 8/1984 | Japan . |
| 62-76825 | 4/1987 | Japan . |
| 4-42622 | 2/1992 | Japan . |

OTHER PUBLICATIONS

"Replay of Digital Video Recordings at Non-Standard Tape Speeds," 13th Int. TV Symposium, Montreux, Wilkinson et al., pp. 409–420, May 30, 1983.

*Primary Examiner*—Joseph Ruggiero
*Attorney, Agent, or Firm*—Fitzpatrick, Cella, Harper & Scinto

[57] ABSTRACT

A data processing apparatus includes an input unit which inputs a code train through a transmission path, including a plurality of parity codes, each of which is constructed by a plurality of data. An error processing section corrects error codes by using the parity codes supplied from the input section, and a counter counts the number of correction processes executed by the error processing section. A selecting section selects an error correction mode of the error processing section in accordance with an output of the counting section, among a plurality of modes including first and second modes having different error correcting capabilities.

35 Claims, 16 Drawing Sheets

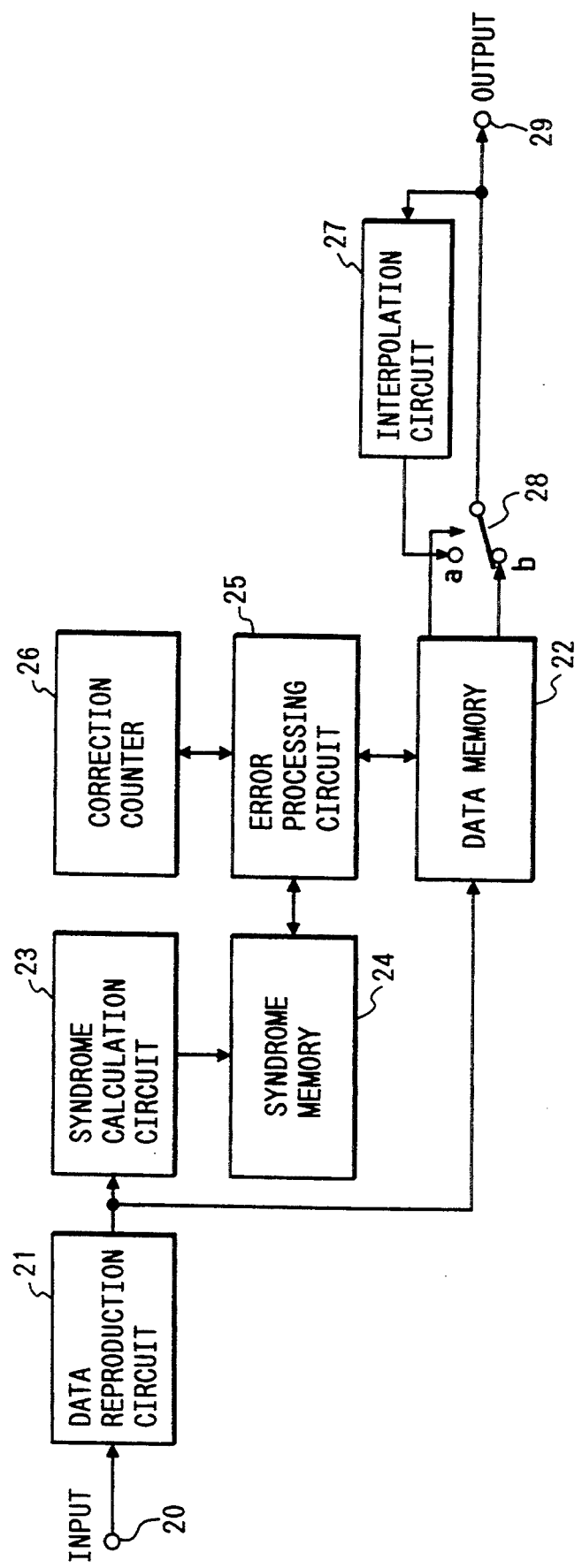

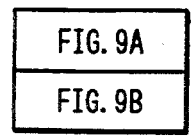
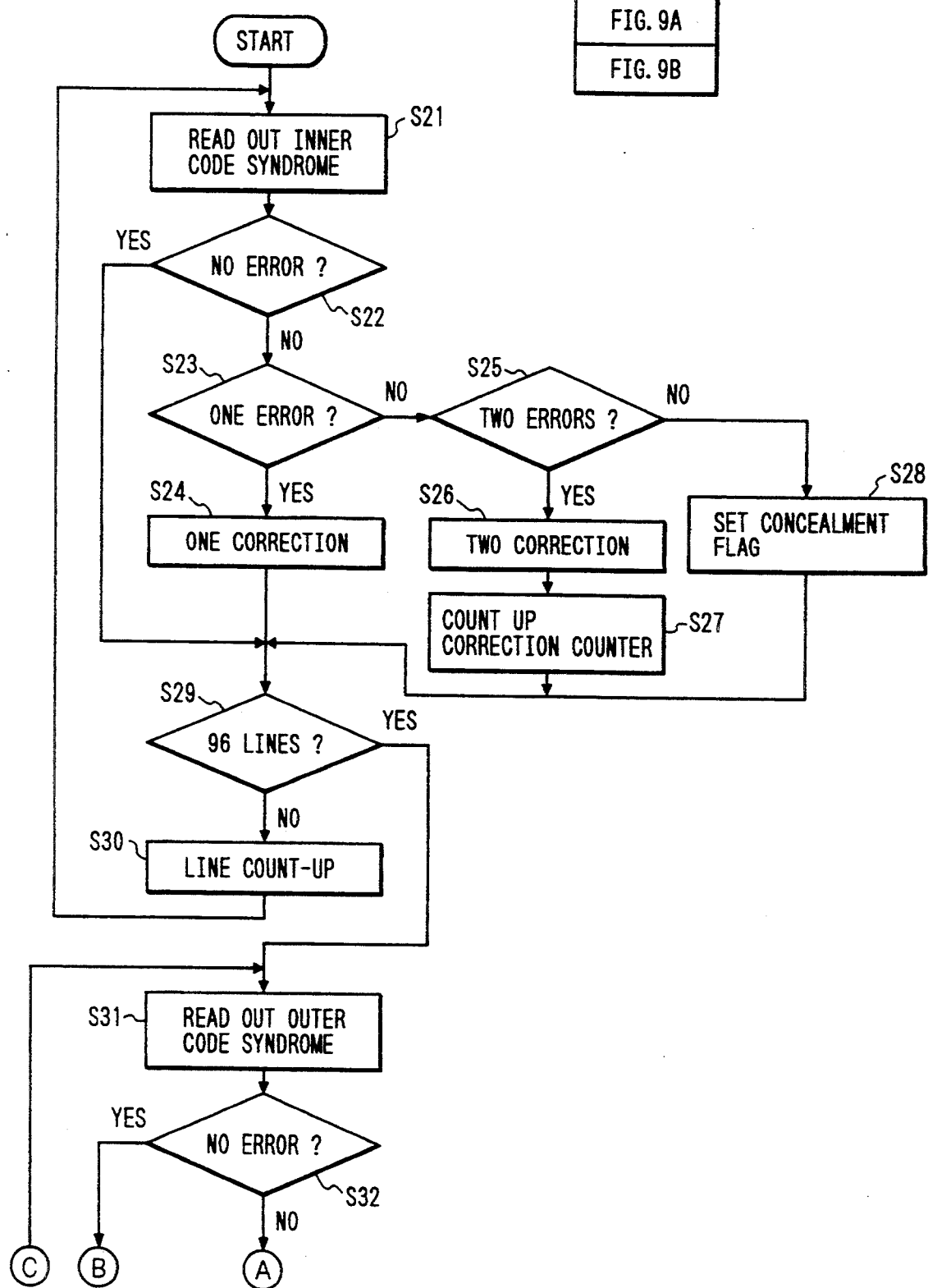

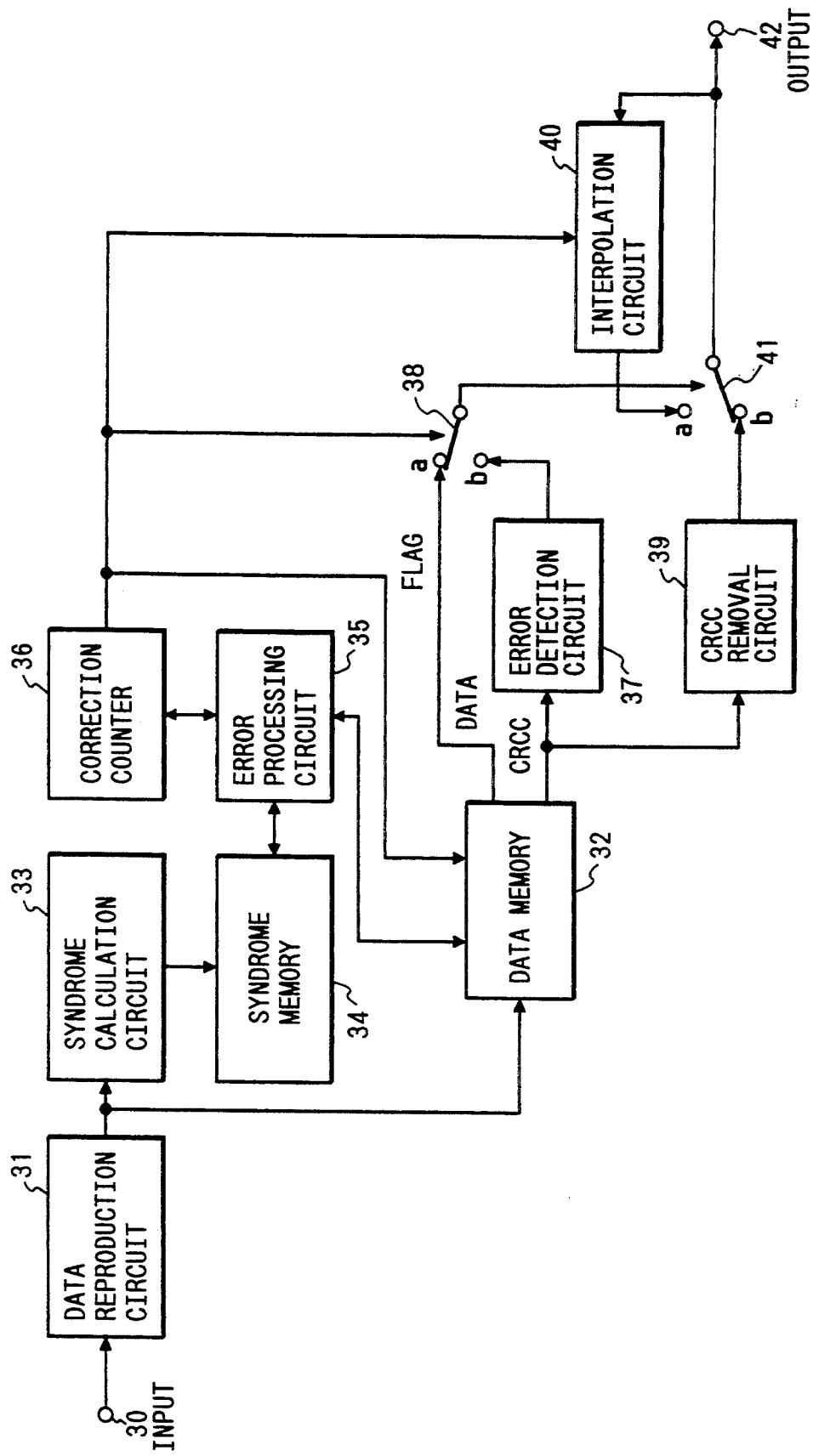

| FIG. 12A |
| FIG. 12B |
| FIG. 12C |

DATA PROCESSING APPARATUS HAVING ERROR DETECTION/CORRECTION CODES

BACKGROUND OF THE INVENTION

1. Field of the Invention

The present invention relates to a data processing apparatus and, more particularly, to error correction of data.

2. Related Background Art

In a transmission system (including a recording and/or reproducing system) of digital data, transmission errors are detected and corrected by error detection/correction codes.

That is, an error detection/correction coding circuit to add an error detection/correction code is provided at the transmission side. A data reproduction processing circuit for detecting and correcting transmission errors by the error detection/correction code and for interpolating uncorrectable errors is provided at the reception side.

A construction of a conventional data processing apparatus for performing error detection and correction will now be described hereinbelow with reference to FIG. 1.

FIG. 1 is a block diagram showing a construction of the conventional data processing apparatus.

In FIG. 1, data (code train) which has been error detection/correction encoded and includes transmission errors at a predetermined probability by the transmitting system is supplied to an input terminal 10.

The above data (code train), for example, is provided from a reproduction head output of a digital video recorder, a reception signal from a digital communication line, or the like.

A data reproduction circuit 11 demodulates the data (code train) from the input terminal 10 and separates each sync block by a sync code of the sync block and recognizes an ID of the sync block.

The data (information data and a parity for error detection/correction) reproduced by the data reproducing circuit 11 is written into a data memory 12 in accordance with the recognized ID.

The reproduction data (code train) generated from the data reproduction circuit 11 is also supplied to a syndrome calculation circuit 13.

In accordance with a well-known method, the syndrome calculation circuit 13 calculates a syndrome for each of the error correction code which is constructed by a plurality of transmission codes and sequentially writes the syndromes of the error correction codes into a syndrome memory 14.

With reference to the memory contents in the syndrome memory 14, an error processing circuit 15 detects and corrects error data (codes) stored in the data memory 12.

In the case where the error data cannot be corrected, a concealment flag is written into the corresponding memory location in the data memory 12.

Practically speaking, first, the error data (codes) are detected with reference to the syndromes stored in the syndrome memory 14. In the case where the error data is correctable, the positions of error and the error pattern are calculated, data (codes) in the data memory 12 is corrected by using the result, and the corrected data is again written into the data memory 12.

In the case where the error data is uncorrectable, the error data in the data memory 12 is held without changing and a concealment flag is newly written into the data memory 12 for a code train including error codes. Specifically speaking, the error processing circuit 15 is constructed by a general digital arithmetic operating circuit in which microprograms and microcodes to execute the above error processes have been loaded and its function can be changed or modified by changing the microprogram.

After completion of the error process by the error processing circuit 15, the data and concealment flag stored in the data memory 12 are sequentially read out and are transmitted from an output terminal 16 to a circuit at the post stage (for example, an interpolation circuit to interpolate the uncorrectable error data).

Such a data processing apparatus is built in the reproducing system of a digital video tape recorder (hereinafter, also simply referred to a VTR).

The error detecting/correcting processes in the digital VTR are described below.

FIG. 2 shows a recording format of one line in the digital VTR. FIG. 3 shows a recording format of one track.

As shown in FIG. 2, one line is constructed by: sync data; an ID; information data of m symbols; and an error detection/correction code (inner code parity) of $(n-m)$ symbols for the information data.

In one track, the code trains of FIG. 2 are comprised of a plurality of lines which are laterally arranged and outer codes are formed in the vertical direction.

A product code block of the error detection/correction is formed by an inner code and an outer code. The transmitting order of signals coincides with the direction of the inner code in FIG. 3.

The error detecting/correcting operation will now be described hereinbelow with reference to a flowchart of FIG. 4. The error correction code is a code which can correct two errors.

Syndromes of the inner code and outer code with respect to each reproduction code train are calculated and stored into the syndrome memory 14.

After the syndromes (q inner code syndromes and m outer code syndromes) of one track are written, the processing flow is started.

First, the error detecting/correcting processes of the inner code are executed.

That is, the syndrome of the first line is read out from the syndrome memory 14 (step S1) and the presence or absence of errors is discriminated (S2).

When one error exists, the one error is corrected (S3, S4). In case of two errors, the two errors are corrected (S5, S6). In case of three or more errors, since they are uncorrectable, a concealment flag is set (S7) and the processing routine advances to the process of the next line. When no error exists, the processing routine also advances to the process of the next line without executing a process. The above processes are executed with respect to P lines of the inner codes (S8, S9).

After completion of the error detecting/correcting processes by the inner code, the error detecting/correcting processes by the outer code is started.

The processes regarding the outer code are fundamentally the same as those for the inner code. With respect to each column, the syndrome of the outer code is read out from the syndrome memory 14 (S10) and the presence or absence of errors is discriminated (S11).

In case of one error, the one error is corrected (S12, S13). In case of two errors, they are corrected. In case of three or more errors, since they cannot be corrected, a concealment flag is set (S16). The processing routine advances to the processes of the next column. When there is no error, the processing routine also advances to the processes of the next column without performing a process.

The above processes are executed with respect to m columns of the outer code (S17, S18).

After completion of the processes of the outer code, a concealment flag as a result of the decoding of the inner code train and outer code train is written into the data memory 12 (S19).

The error detection/correction processing operation of data is executed as described above.

The data whose errors cannot be corrected by the above error detecting/correcting circuit in the data supplied from the output terminal 16 can be error corrected by interpolation.

In an electromagnetic converting system such as a VTR, however, there is a case where a burst error occurs due to a choking of a head or a scratch on a magnetic tape and an error ratio rapidly deteriorates.

For instance, it is now assumed that errors as shown in FIG. 6 occurred in a recording and/or reproducing apparatus for recording and/or reproducing image data (information data) onto/from a magnetic tape by a recording format as shown in FIG. 5.

In FIG. 6, it is assumed that burst errors occurred at all of the positions shown by two lateral lines (a and b) and two vertical lines (c and d) each of which is formed by connecting two marks "x".

In such a case, to perform the error detection and correction by the inner code, it is necessary to execute two-correcting processes of 94 code trains excluding the lateral lines a and b and an uncorrectable error process of two code trains of the lines a and b.

The 2-correcting process of 94 code trains is needed for the error detection/correction by outer codes.

FIG. 7 shows the number of steps (numerical value on the right side in each block) in an error detecting/correcting step corresponding to the flowchart of FIG. 4.

It is now assumed that the number of steps of the time which can be divided in one track for the error detecting/correcting processes of the inner code and outer code is set to 20,000 steps. The number of steps to detect/correct errors in the case where error data as shown in FIG. 6 occurred. For the two-correcting process of the inner code, 11,280 steps are needed, and for the uncorrectable error process, 40 steps are needed. For the two-correcting process of the outer code, 11,040 steps are needed, and for the writing process of the concealment flag, 960 steps are needed.

That is, the time of 23,320 steps are necessary per track and such a time duration exceeds the time which can be allocated per track, so that an adequate time to write the concealment flag into the data memory is lacking.

According to the conventional apparatus as mentioned above, in the case where a number of errors occurred, the concealment flag cannot also be written, so that there occurs a problem such that in the case where the error uncorrectable code is image data, even if the operator tries to interpolate such uncorrectable image data by the post stage, there is no surplus time to execute the interpolation.

SUMMARY OF THE INVENTION

Under such circumstances, it is an object of the present invention to provide a data processing apparatus in which the above problems can be solved and even in the case where a large number of error data occurred, the detecting/correcting and concealing processes of the error data can be completed within a predetermined time.

To accomplish the above object, according to a preferred embodiment of the present invention, there is provided a data processing apparatus comprising: a data memory to store input information data; error processing means for detecting/correcting errors added to the input information data which is stored into the data memory by using a detection/correction code; and counting means for counting a predetermined number of correction processing times by the error processing means. The operation of the error processing means is switched in accordance with a count value of the counting means.

The above and other objects and advantages of the present invention will become apparent from the following detailed description and the appended claims with reference to the accompanying drawings.

BRIEF DESCRIPTION OF THE DRAWINGS

FIG. 8 is a block diagram of a data processing apparatus of a first embodiment according to the present invention;

FIG. 10 is a block diagram of a data processing apparatus of a second embodiment according to the present invention;

DETAILED DESCRIPTION OF THE PREFERRED EMBODIMENTS

Figure 1:
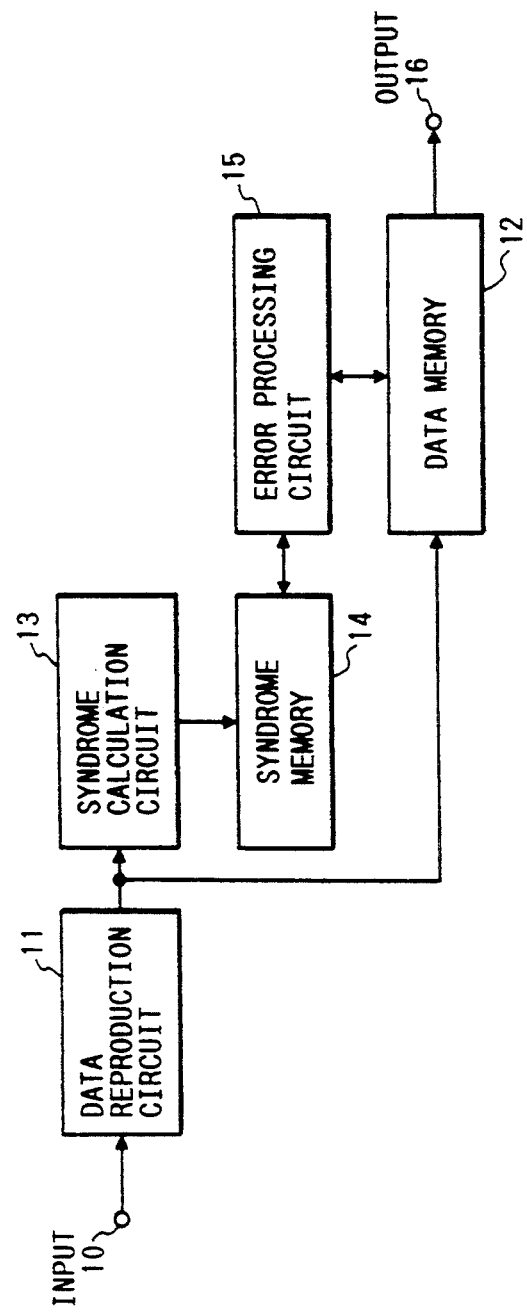
FIG. 1 is a block diagram of a conventional data processing apparatus.
Figure 2:
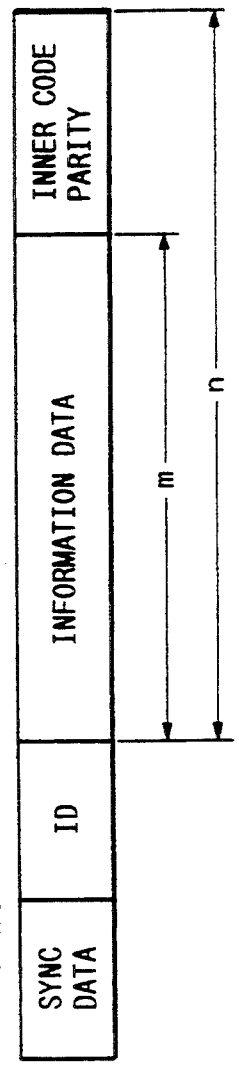
FIG. 2 is a diagram showing a recording format of a sync block in a digital VTR.
Figure 3:
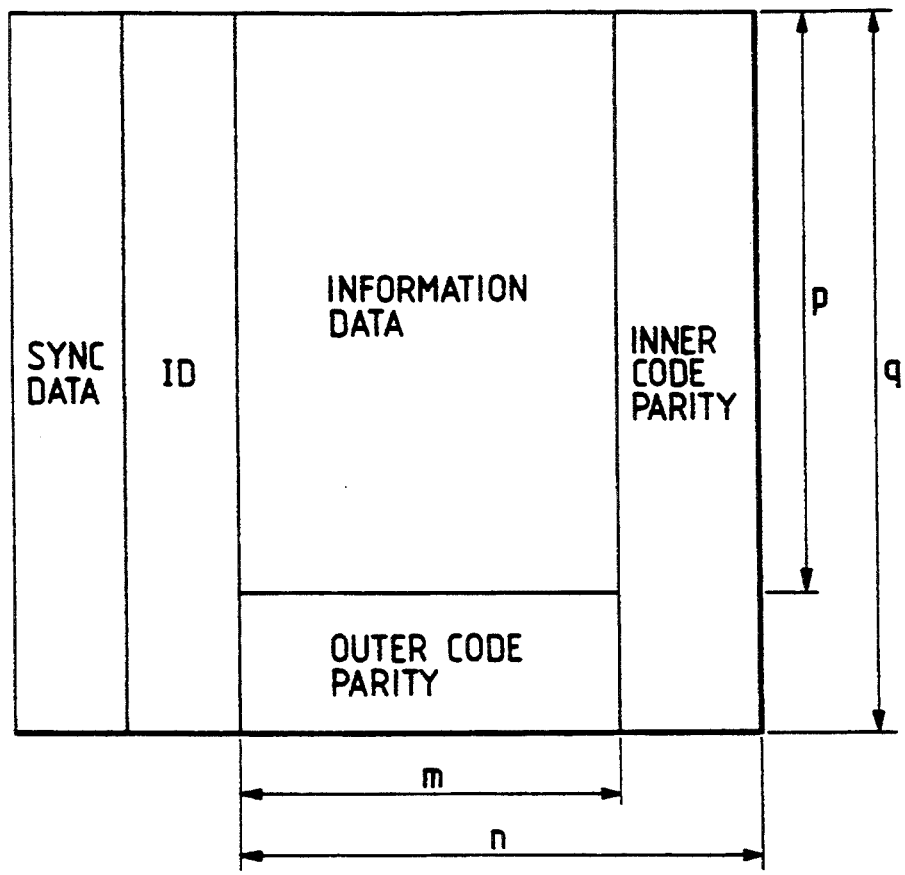
FIG. 3 is a logical format of one track in the digital VTR.
Figure 4:
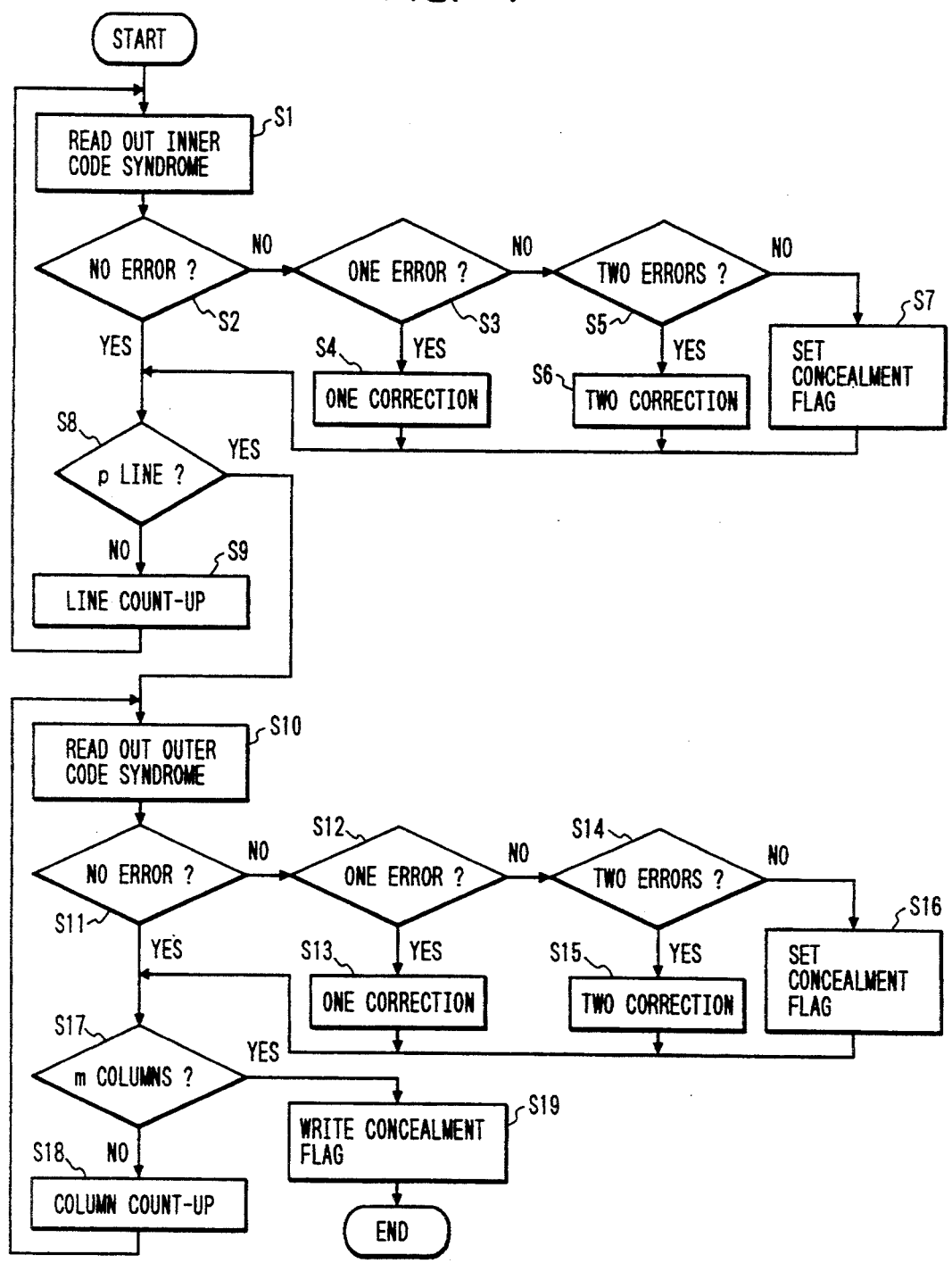
FIG. 4 is a flowchart showing the operation of an error processing circuit 15 in FIG. 1.

A data processing apparatus of the first embodiment according to the present invention will now be described in detail hereinbelow with reference to the drawings.

FIG. 8 is a block diagram of the data processing apparatus of the first embodiment according to the invention.

Reference numeral 20 denotes an input terminal. A data (code train) to which inner codes and outer codes for error detection/correction have been added and which has been divided into sync blocks is supplied to the input terminal 20. Reference numeral 21 denotes a data reproduction circuit for demodulating the data sent from the input terminal 20 and for generating reproduction data (code train) of every sync block; 22 a data memory to temporarily store the data (code train) (information data and a parity for error detection/correction) reproduced by the data reproduction circuit 21; 23 a syndrome calculation circuit to calculate a syndrome from the reproduction data which is generated from the data reproduction circuit 21; and 24 a syndrome memory to store the syndrome calculated by the syndrome calculation circuit 23.

Reference numeral 25 denotes an error processing circuit for detecting and correcting the error data (codes) stored in the data memory 22 with reference to the syndromes of the inner code train or outer code train stored in the syndrome memory 24 and for setting a concealment flag in the case where the error data is uncorrectable; 26 a correction counter to count the number of a two-error correcting process of the error processing circuit 25; and 27 an interpolation circuit to form interpolation data from the data (codes) read out from the data memory 22. The uncorrectable error code is substituted for the previous value by the interpolation circuit 27 and is transferred to an output terminal 29.

Reference numeral 28 denotes a switch to select either one of a mode to supply the data (codes) from the interpolation circuit 27 to the output terminal 29 and a mode to supply the data (codes) from the data memory to the output terminal 29. The switch 28 is controlled by the concealment flag read out from the data memory 22. Namely, the switch 28 is connected to a contact a when the concealment flag has been set into the data read out from the data memory 22. The switch 28 is connected to a contact b when the concealment flag is not set.

Reference numeral 29 denotes the output terminal to transmit the data to the outside.

Although the details will be explained hereinafter, the error processing circuit 25 generally processes up to the two-error detection/two-error correction. However, when a count value by the correction counter 26 is equal to or larger than a predetermined value within a predetermined period of time (or a predetermined process), the error processing circuit 25 immediately sets the concealment flag without executing the correcting process to two or more errors. The above predetermined value has previously been stored in the error processing circuit 25.

The error processing circuit 25 is constructed of a general digital arithmetic operating circuit in which microprograms and microcodes to execute the above error processes have been loaded.

The processing operation of FIG. 8 will now be described in detail hereinbelow.

The data (code train) to which inner codes and outer codes for error detection/correction have been added and divided into sync blocks and in which transmission errors occurred at a predetermined probability due to the transmitting system is supplied to the input terminal 20.

The data reproduction circuit 21 demodulates the data (code train) from the input terminal 20 and separates each sync block by the sync code of the sync block and recognizes an ID of the sync block.

The reproduction data (information data and a parity for error detection/correction) reproduced by the data reproduction circuit 21 is written into the data memory 22 in accordance with the recognized ID.

The reproduction data by the data reproduction circuit 21 is also supplied to the syndrome calculation circuit 23. By a well-known method, the syndrome calculation circuit 23 calculates the syndrome for error detection/correction for every error correction code which is constructed by a plurality of transmission codes from the reproduction data. The syndrome calculation circuit 23 sequentially writes a plurality of syndromes of the error correction codes (inner codes and outer codes) into the syndrome memory 24.

The error processing circuit 25 detects and corrects the error data (codes) of the data memory 22 with reference to the syndrome memory 24. In the case where the error data is uncorrectable, the error processing circuit 25 writes a concealment flag into the corresponding portion in the data memory 22. When the error processing circuit 25 executes the two-error correcting process, a count value of the correction counter 26 is counted up increased.

Practically speaking, the error processing circuit 25 first detects errors with reference to the syndromes stored in the syndrome memory 24. In the case where the error data is correctable, the error processing circuit 25 calculates the error position and error pattern and corrects the data (codes) in the data memory 22 by using the results of the calculation.

That is, as for the correctable error, the error data corresponding to the calculated error position is read out from the data memory 22 and the error pattern is added and the resultant data is again written into the data memory 22. Further, when the two-error correcting process is executed, the count value of the correction counter 26 is counted up increased.

On the other hand, in the case where the error data is uncorrectable, the error data in the data memory 22 is held without changing and the concealment flag is written into the data memory 22 for the code train including the error data.

As mentioned above, the count value of the correction counter 26 is counted up increased each time the two-error correcting process is executed by the error processing circuit 25. After completion of the processes of one track, the correction counter 26 is reset.

When the count value of the correction counter 26 is equal to or larger than a predetermined value (117 in the embodiment) in a predetermined period of time (or a predetermined process like an error process by the inner code), the processing mode of the error processing circuit 25 is switched to the mode to execute simpler error processes which can be performed for a short time thereafter.

After completion of the error processes by the error processing circuit 25, the data (including the concealment flag) in the data memory 22 is sequentially read out and either one of the mode to transmit the interpolation data of the interpolation circuit 27 to the output terminal 29 and the mode to transmit the information data read out from the data memory 22 to the output terminal 29 is selected in accordance with the concealment flag.

The embodiment will now be described with respect to an example of the case where the foregoing data processing apparatus is built in the reproducing system of the digital video tape recorder (VTR) in a manner similar to the case of the conventional apparatus.

Figure 5:
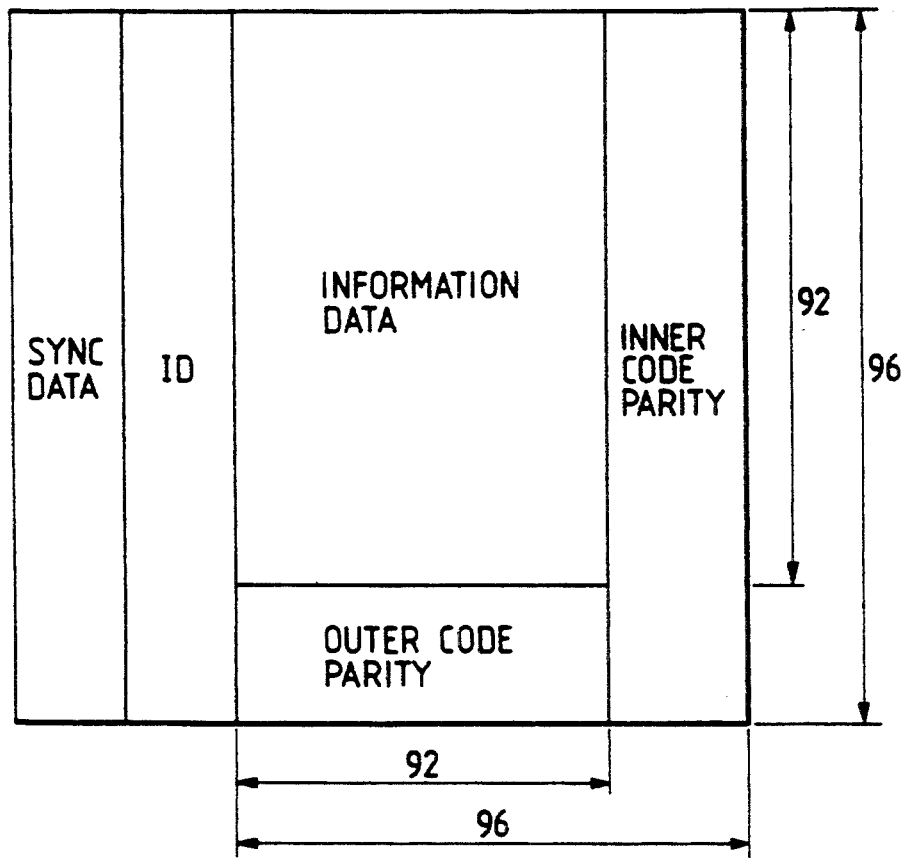
FIG. 5 is a logical format of one track in the digital VTR.
Figure 9B:
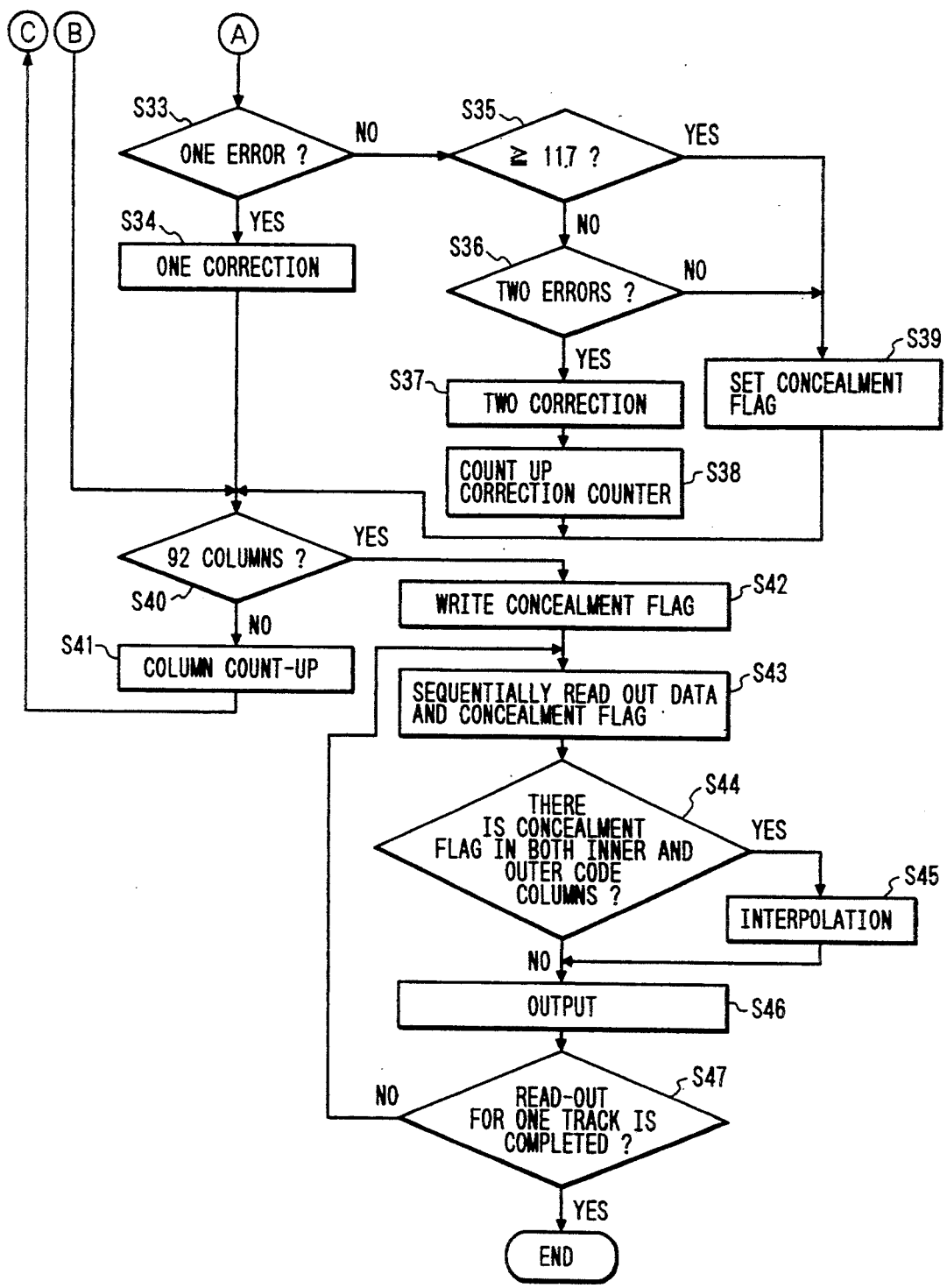
FIG. 9 is comprised of FIGS. 9A and 9B showing a flowchart for explaining the operation of detecting/correcting and concealing processes of error data in the first embodiment.

FIG. 9 is a flowchart for the error detecting/correcting and concealing processes according to the embodiment in the data format shown in FIG. 5 and is described in conjunction with the conventional apparatus.

First, the data (data (code train) to which the inner codes and outer codes for error detection/correction have been added and divided into sync blocks, and in which transmission errors occurred at a predetermined probability due to the transmitting system), which is supplied from the input terminal 20 is demodulated by the data reproduction circuit 21. The data is separated into the sync blocks in accordance with the sync code of the sync block and the ID of the sync block is recognized.

Each code train (information data and a parity for error detection/correction) reproduced by the data reproduction circuit 21 is sequentially written into the data memory 22 in accordance with the recognized ID.

The syndromes of the inner code and outer code are calculated with respect to each of the reproduced code trains and are stored in the syndrome memory 24.

After the syndromes of one track and the code trains are respectively written into the syndrome memory 24 and data memory 32, the processing flow of FIG. 9 is started.

First, the error detecting/correcting processes of the inner code are executed.

That is, in step S21, the syndrome of the first line is read out from the syndrome memory 24. When the process of the first line is executed, the count value of the line counter provided in the error processing circuit 25 is set to "1".

The presence or absence of errors is checked by the read-out syndromes in step S22.

When no error exists in step S22, the processing routine advances to step S29. When there are some errors, the processing routine advances to step S23.

In step S23, a check is made to see if one error exists or not. In case of one error, step S24 follows and the position of the error data (codes) and the error pattern are calculated. The error data corresponding to the calculated error position is read out from the data memory 22 and the error pattern is added and the resultant data is again written into the data memory 22. The processing routine advances to step S29.

If NO in step S23, step S25 follows and a check is made to see if two or more errors exist or not.

In case of two errors, step S26 follows and those two errors are corrected. The processing routine advances to step S27.

In step S27, the count value of the correction counter 26 is counted up.

If NO in step S25, namely, in case of three or more errors, step S28 follows. Since the errors are uncorrectable, the error data in the data memory 22 is held without changing and the concealment flag for the code train including the error data is set and the processing routine advances to step S29.

A check is made in step S29 to see if the process of the 96th line has been finished or not. If NO, step S30 follows and the count value of the line counter is counted up and the processing routine is returned to step S21. When the process of the 96th line is finished, step S31 follows and the error detecting/correcting process by the outer code is executed.

In step S31, the syndrome of the first column of the outer code is read out from the syndrome memory 24. In case of executing the process of the first column, the count value of the column counter included in the error processing circuit 25 is set to "1".

In step S32, the presence or absence of errors is checked. When no error exists, step S40 follows. When errors exist, step S33 follows.

In step S33, a check is made to see if one error exists or not. When there is one error, step S34 follows and the position and the error pattern of the error data are calculated. The error data corresponding to the calculated error position is read out from the data memory 22 and the error pattern is added and the resultant data is again written into the data memory. The error is corrected and step S40 follows.

If NO in step S33, step S35 follows and a check is made to see if the count value of the correction counter 26 is equal to or larger than 117 or not. When the count value is less than 117, step S36 follows. If YES in step S35, the processing routine advances to step S39.

In step S36, a check is made to see if the number of errors is equal to 2 or not. If NO, namely, when three or more errors exist, step S39 follows. In step S39, the error data in the data memory 22 is held without changing and the concealment flag is set for the code train during the execution of the process. The processing routine advances to step S40.

When the number of errors is equal to two in step S36, step S37 follows and the two errors are corrected. The processing routine advances to step S38.

In step S38, the count value of the correction counter 26 is counted up and step S40 follows.

A check is made in step S40 to see if the process of the 92nd column has been finished or not. If NO, step S41 follows and the count value of the column counter is counted up and the processing routine is returned to step S31.

When the process of the 92nd column is finished in step S40, step S42 follows.

In step S42, the concealment flags as results of the decoding of the inner code and outer code is written into the data memory 12 and the error detecting/correcting process is finished.

In step S43, the data (information data) and the concealment flags as results of the decoding of the inner code train and outer code train are sequentially read out from the data memory 22.

In step S44, a check is made to see if the concealment flags have been set with regard to both of the inner code train and the outer code train or not. If YES, step S45 follows and it is determined that the data corresponding to the concealment flags are wrong. The error data is interpolated by the interpolation circuit 27 and step S46 follows.

When no concealment flag is set for at least either one of the inner code train and the outer code train, it is determined that the data read out from the data memory 22 is correct, so that the processing routine advances to step S46. In step S46, the data (interpolation data or read-out data) is output from the output terminal 29.

In step S47, a check is made to see if the data of one track has been read out or not. If NO, the processing routine is returned to step S43. If YES, the processing flow is finished.

In other words, according to the embodiment, when the count value of the correction counter is equal to or larger than a predetermined value, the correction processing mode is switched from the two-error correction to the one-error correction.

Figure 6:
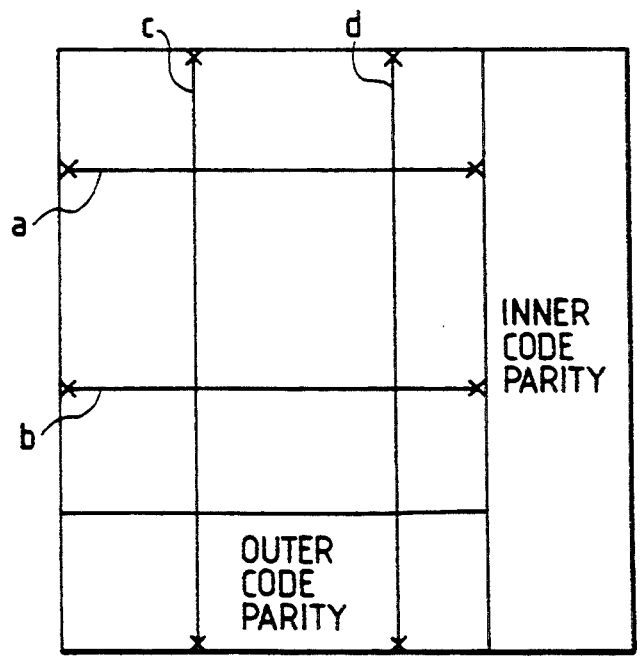
FIG. 6 is a diagram showing an example of the occurrence of errors.

For instance, it is now assumed that the transmission errors as shown in FIG. 6 occurred in the format shown in FIG. 5 which has already been described in the conventional apparatus.

In the example, since the number of 2-correction processing times by the inner code is equal to 94, the 2-correction process by the outer code is executed up to the 23rd code train and the uncorrectable-error process is performed with respect to the remaining 71 code trains.

Figure 7:
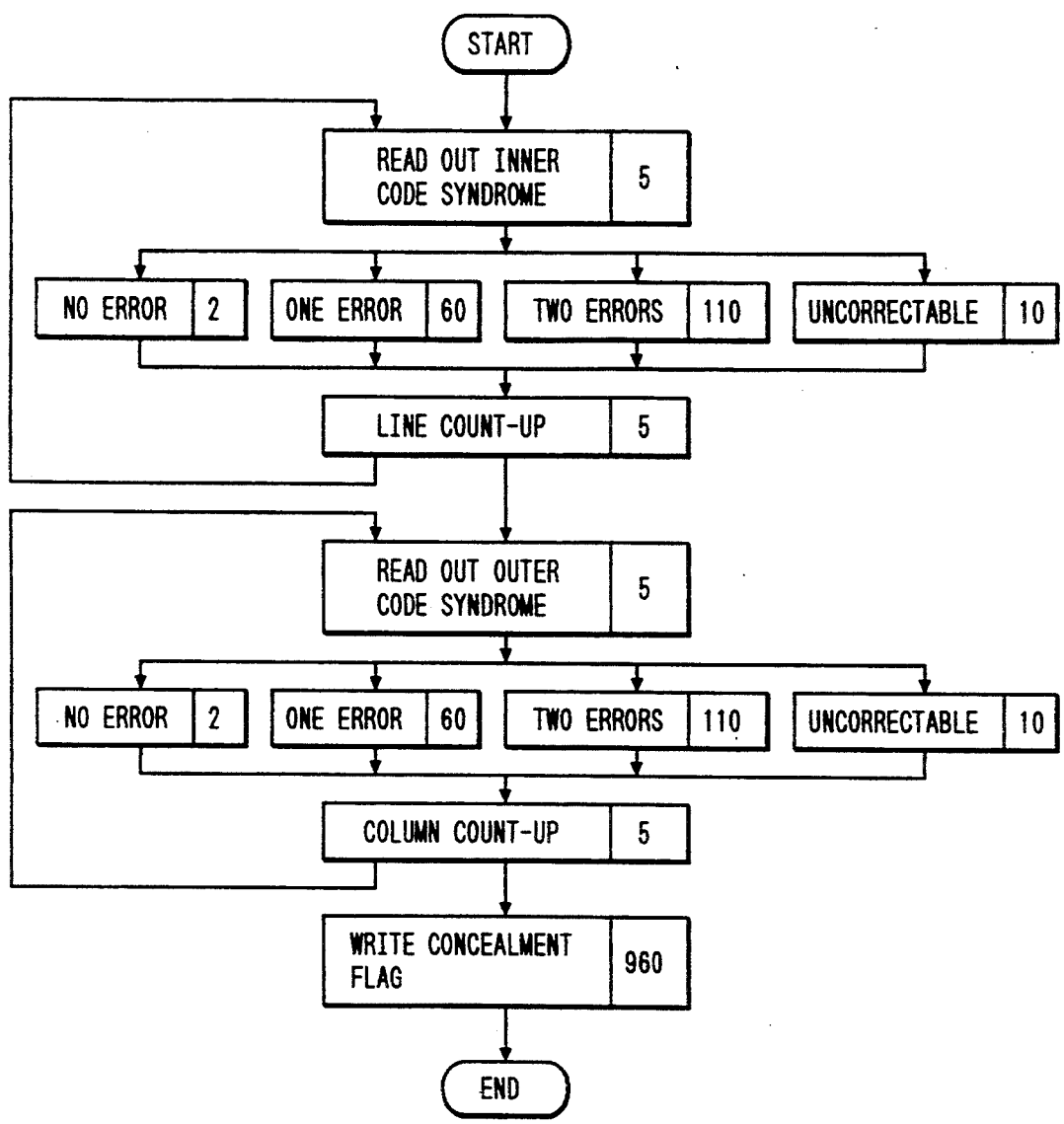
FIG. 7 is a diagram showing an example of the number of steps of error processes.

Namely, the time which is required to execute the process of one track is now calculated on the basis of FIG. 7. For the 2-correction by the inner code, 11,280 steps are needed, and for the uncorrectable-error process, 40 steps are needed. For the 2-correction by the outer code, 2,760 steps are needed, and for the writing of the concealment flag, 960 steps are needed. A total 16,460 steps are necessary. All of the processes of the error detection/correction can be finished within the processing time of one track corresponding to 20,000 steps.

The switching operation of the processes in the error processing circuit 25 is also not limited to switching from the 2-correction to the 1-correction.

As will be easily understood from the above description, according to the first embodiment, the processing time for error detection/correction can be selected in accordance with a situation of the occurrence of errors. Even when the number of errors is large, the error detecting/correcting process can be completed within a predetermined time. The present invention, therefore, is very effective for the reproducing process of, for example, a moving image of a digital VTR or the like.

A data processing apparatus according to the second embodiment of the invention will now be described hereinbelow with reference to the drawings.

FIG. 10 is a block diagram of a data processing apparatus of the second embodiment according to the invention.

Figure 11:
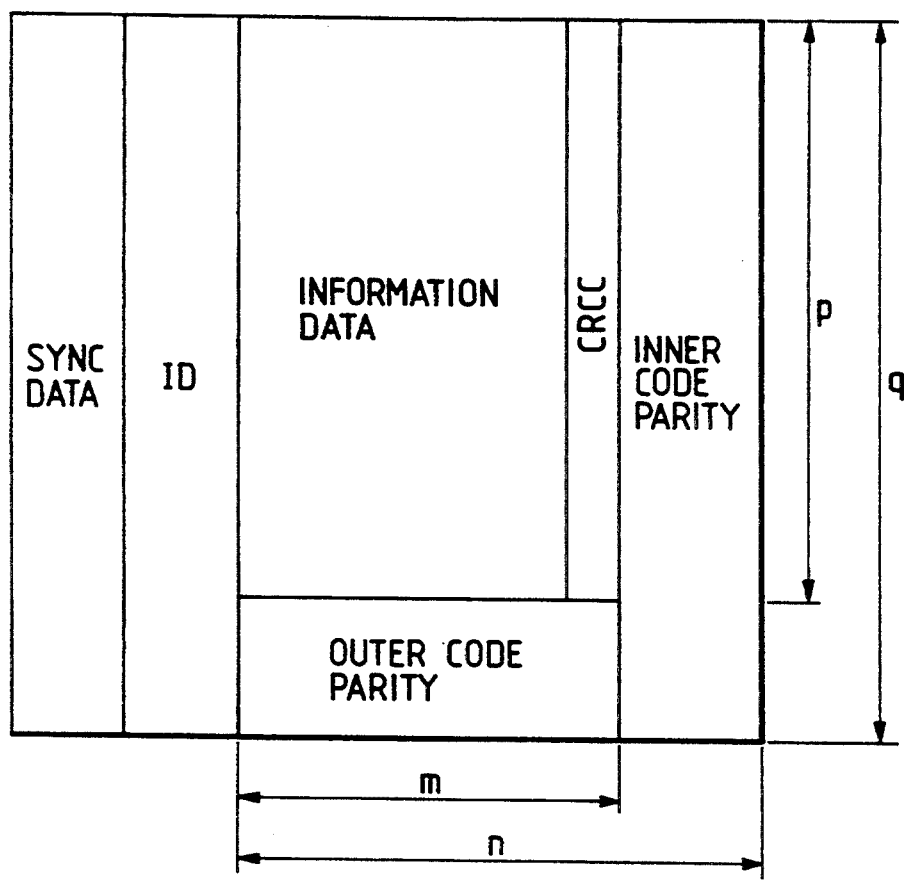
FIG. 11 is a logical format of one track in a digital VTR in the second embodiment.

FIG. 11 shows a data transmission format of the second embodiment. In the embodiment, in addition to an inner code parity and an outer code parity of error correction, an error detection code CRCC (Cyclic Redundancy Check Code) is added as shown in FIG. 11.

In FIG. 10, reference numeral 30 denotes an input terminal. The data (code train) such that the error detection code CRCC is added to the information data and the inner code parity and outer code parity of error correction are added to the information data and the data has been divided into sync blocks is supplied to the input terminal 30. Reference numeral 31 denotes a data reproduction circuit for demodulating the data (code train) supplied to the input terminal 30 and for generating the reproduction data and its ID every sync block; 32 a data memory to temporarily store the data (information data and its error detection code CRCC) reproduced by the data reproduction circuit 31; 33 a syndrome calculation circuit to calculate syndromes from the reproduction data obtained from the data reproduction circuit 31; and 34 a syndrome memory to store the syndromes calculated by the syndrome calculation circuit 33.

Reference numeral 35 denotes an error processing circuit for detecting and correcting the error data (codes) in the data memory 32 and for setting a concealment flag in the case where the error data is uncorrectable; and 36 a correction counter to count the number of correction processing times of the error processing circuit 35.

In a manner similar to the error processing circuit 25 described in the first embodiment, the error processing circuit 35 is constructed by a general digital arithmetic operating circuit in which microprograms and microcodes to execute the above error processes have been loaded.

Reference numeral 37 denotes an error detection circuit for detecting the error data of the information data from the data (information data and its error detection code CRCC) read out from the data memory 32; and 38 a switch to select the signal (a contact) indicative of the concealment flag which is read out from the data memory 32 or the detection signal (b contact) which is generated from the error detection circuit 37. The switch 38 is controlled by an output of the correction counter 36.

Reference numeral 39 denotes a CRCC removal circuit for eliminating the error detection code CRCC from the data including the information data and its error detection/correction code CRCC read out from the data memory 32; 40 an interpolation circuit to form the interpolation data from an output (information data) of the CRCC removal circuit 39; and 41 a switch to supply either one of the interpolation data of the interpolation circuit 40 from the a contact and the information data which is supplied from the CRCC removal circuit 39 through the b contact to an output terminal 42. The switch 41 is switched by an output of the switch 38. The interpolation circuit 40 is controlled by the output of the correction counter 36. Reference numeral 42 denotes the output terminal for the data which is generated from the CRCC removal circuit 39 or the interpolation data.

The operation of FIG. 10 will now be described in detail hereinbelow.

A data train of a transmission format as shown in FIG. 11 is supplied from a transmitting medium to the input terminal 30.

The data reproduction circuit 31 demodulates the data from the input terminal 30 and separates into the sync blocks in accordance with the sync code of the sync block and recognizes the ID of each sync block.

The data (information data and its error detection code CRCC) reproduced by the data reproduction circuit 31 is written into the data memory 32 in accordance with the recognized ID.

The data (information data, error detection code CRCC, and their parities for error detection/correction) is supplied to the syndrome calculation circuit 33. By a well-known method, the syndrome calculation circuit 33 calculates the syndromes for error detection/correction every error correction code which is constructed by a plurality of transmission codes. A plurality of syndromes of the error correction codes are sequentially written into the syndrome memory 34.

The error processing circuit 35 detects and corrects the errors of the data stored in the data memory 32 with reference to the syndromes stored in the syndrome memory 34. In the case where the errors are uncorrectable, the concealment flag is written at the corresponding location in the data memory 32.

The correction counter 36 counts the number of correction processing times by the error processing circuit 35 in a predetermined period of time.

Practically speaking, the error processing circuit 35 first detects the errors with reference to the syndromes stored in the syndrome memory 34 and calculates the error position and error pattern in case of the correctable errors and corrects the data (codes) in the data memory 32 by using the results of the calculation.

That is, as for the correctable errors, the error data which is stored at the calculated error position is read out from the data memory 34 and the error pattern is added and the resultant data is again written into the data memory 32. In this instance, the count value of the correction counter 36 is counted up.

On the other hand, in case of the uncorrectable errors, the error data in the data memory 32 is held without changing and the concealment flag is written into the data memory 32 for the code train including the error data.

When the number of correction processing times reaches a predetermined value within a predetermined period of time, the correction counter 36 generates a control signal and instructs the stop of the correcting process to the error processing circuit 35 and also instructs the data reading operation to the data memory 32. The correction counter 36 allows the switch 38 to be switched to the b contact and also allows the interpolation circuit 40 to select an easier (namely, can be processed in a short time) interpolating method.

This is because in the case where a number of transmission errors occurred or the like, if the correcting process by the parity for error correction is strictly executed, the time to process the subsequent input data lacks, so that the subsequent correcting process is stopped and the processing method is switched to the simpler interpolating method.

After completion of the error process by the error processing circuit 35, or when the count value of the correction counter 36 reaches a predetermined value, the information data and its error detection code CRCC and their concealment flags are sequentially read out from the data memory 32.

The information data and its error detection code CRCC are supplied to the error detection circuit 37 and CRCC removal circuit 39. The concealment flag is supplied to the a contact of the switch 38.

The error detection circuit 37 detects the errors of the information data by the CRCC and sets a CRC flag when there is an error.

When the count value of the correction counter 36 is less than a predetermined value, namely, when the number of transmission errors is small, the switch 38 is connected to the a contact and the interpolation circuit 40 forms an interpolation value by an advanced interpolating method.

The information data and its error detection code CRCC which have been read out from the data memory 32 are applied to the CRCC removal circuit 39 and the CRCC is eliminated.

The concealment flag read out from the data memory 32 is used to control the switch 41 through the switch 38.

When the concealment flag is set to "1", the switch 41 is connected to the a contact, so that the interpolation value by the interpolation circuit 40 is supplied to the output terminal 42.

When the concealment flag is not set to "1", the switch 41 is connected to the b contact, so that the output (information data) of the CRCC removal circuit 39 is supplied to the output terminal 42.

When the count value of the correction counter 36 is equal to or larger than a predetermined value, namely, when the number of transmission errors is large, the switch 38 is connected to the b contact and the interpolation circuit 40 forms the interpolation value by using the simpler interpolating method.

The information data and its error detection code CRCC read out from the data memory 32 are supplied to the error detection circuit 37 and CRCC removal circuit 39.

The CRCC removal circuit 39 eliminates the error detection code CRCC from the information data and its CRCC.

The error detection circuit 37 detects the errors by the CRCC and sets the CRC flag to "1" when there is an error. An output of the error detection circuit 37 is used to control the switch 41 through the switch 38.

When errors are detected by the CRCC, the switch 41 is connected to the a contact and the interpolation value obtained by the interpolation circuit 40 is transmitted from the output terminal 42.

When no error is detected by the CRCC, the switch 41 is connected to the b contact and an output (information data) of the CRCC removal circuit 47 is transmitted from the output terminal 42.

The case where the digital video tape recorder (VTR) is assembled in the reproducing system in a manner similar to the case of the conventional apparatus will now be described.

In such a case, in FIG. 11, m is set to 92 columns, n is set to 96 columns, p is set to 92 lines, and q is set to 96 lines.

Figure 12:
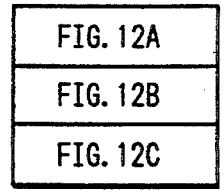
FIG. 12 is comprised of FIGS. 12A to 12C showing a flowchart for explaining the operation of error data detecting/correcting and concealing processes in the second embodiment.
Figure 12A:
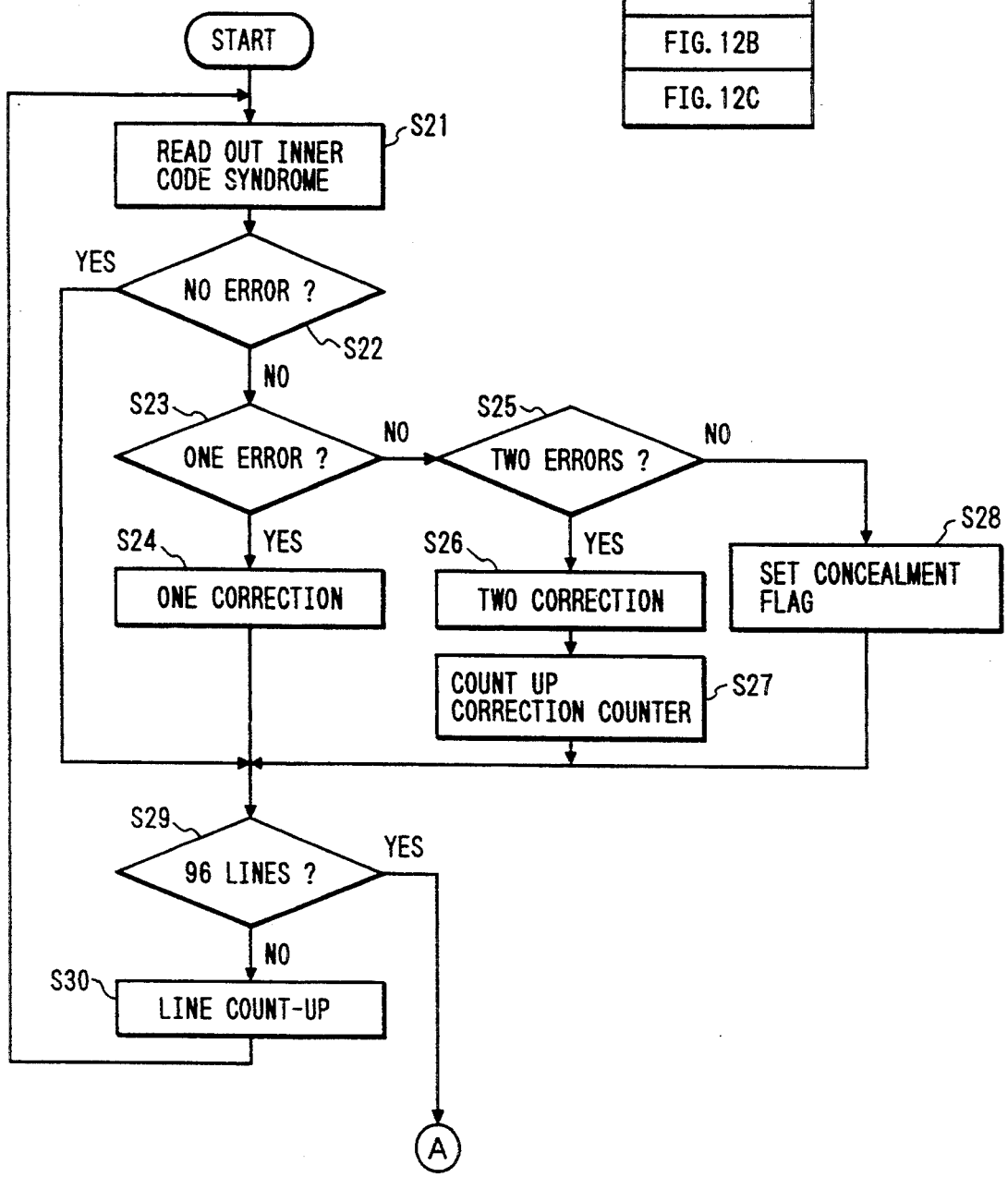
Figure 12B:
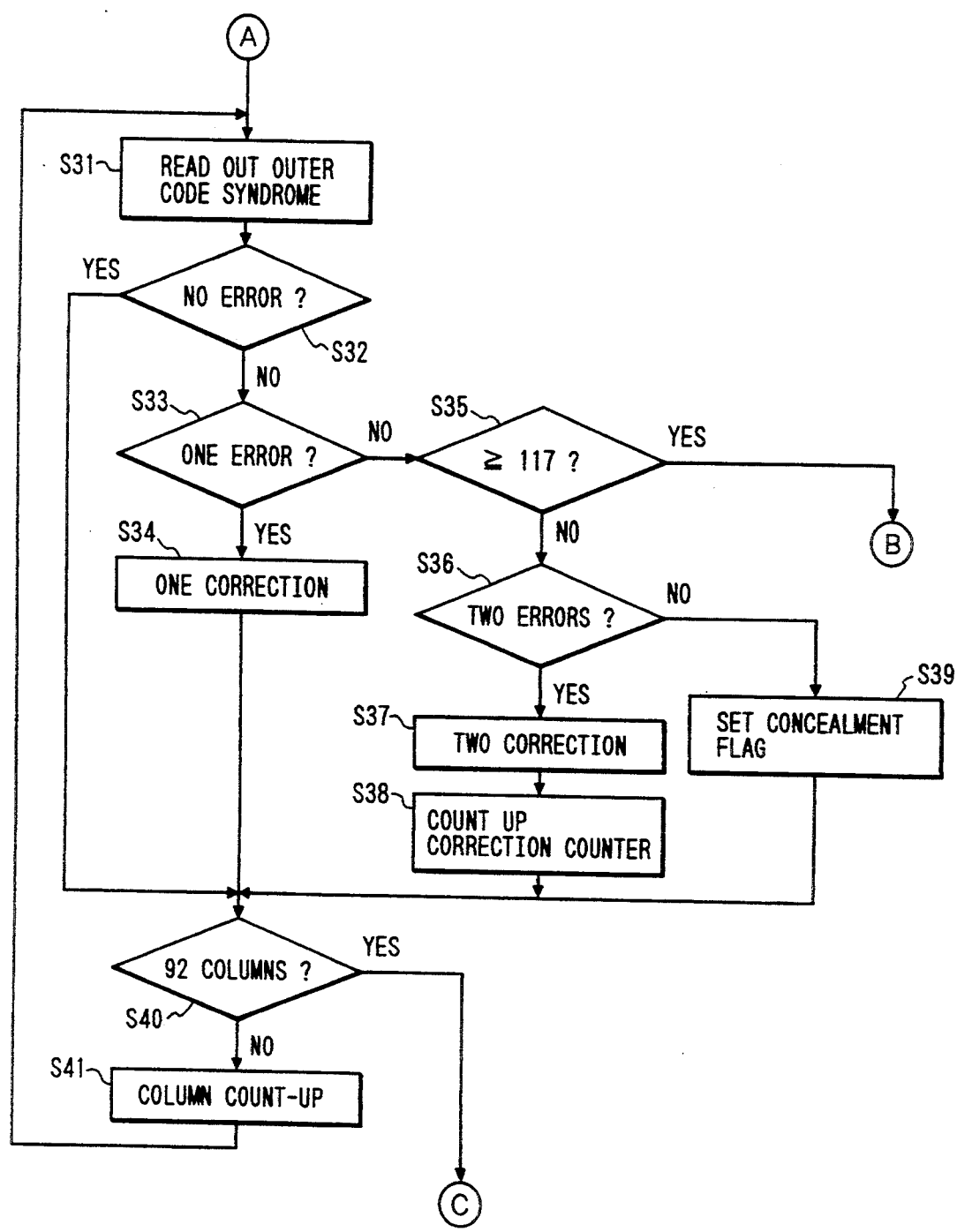
Figure 12C:
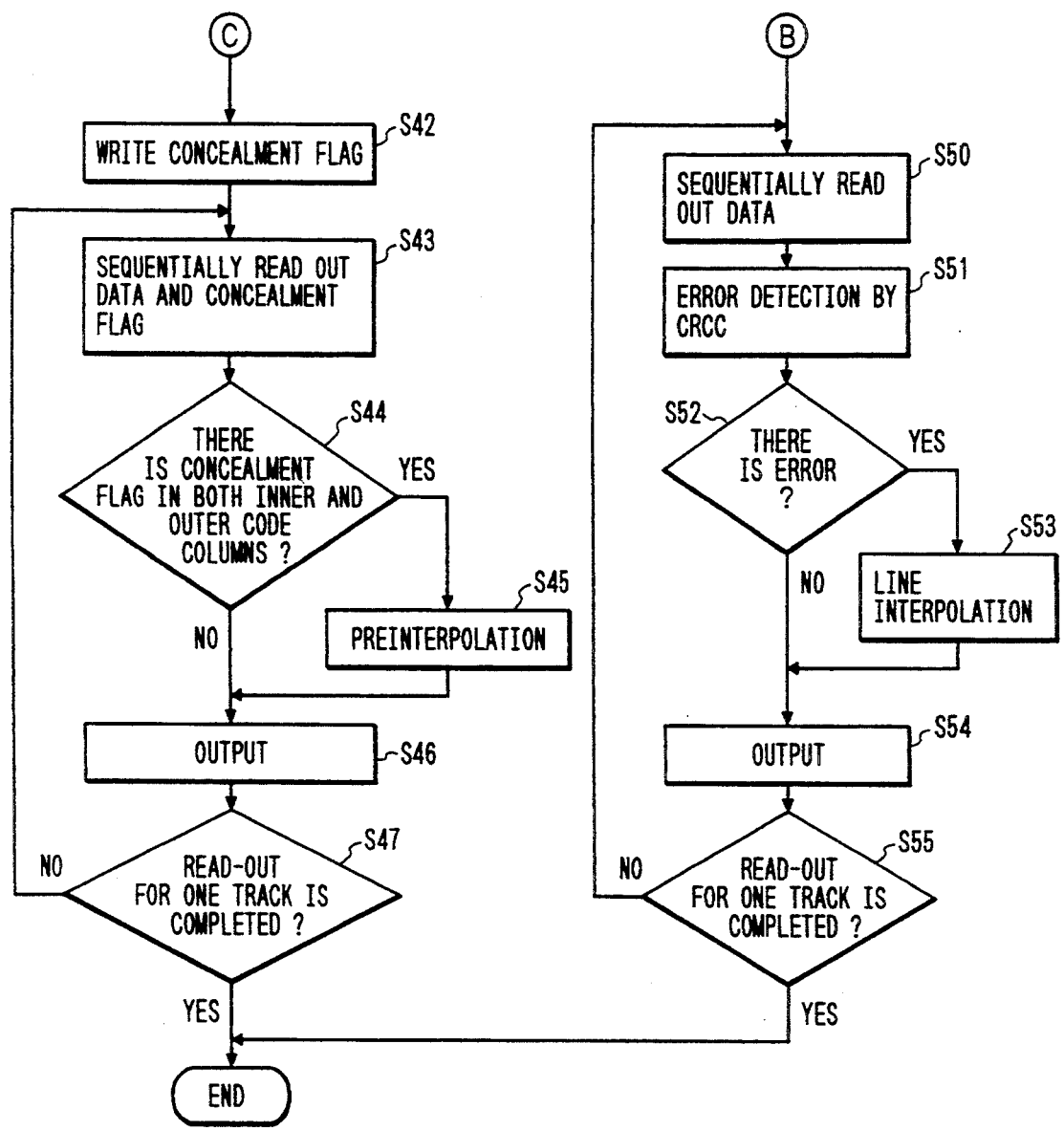

FIG. 12 is a flowchart for the error detecting/correcting process of the embodiment.

In FIG. 12, the same processes as those in FIG. 9 are designated by the same step number and their descriptions are omitted here.

In FIG. 12, only the processes different from those of FIG. 9 will be described hereinbelow. In the description regarding FIG. 12, the data reproduction circuit 31, data memory 32, syndrome memory 34, error processing circuit 35, correction counter 36, interpolation circuit 40, and output terminal 42 correspond to the data reproduction circuit 21, data memory 22, syndrome memory 24, error processing circuit 25, correction counter 26, interpolation circuit 27, and output terminal 29 described in FIG. 9, respectively.

In step S35, a check is made to see if the count value of the correction counter 36 is equal to or larger than 117 or not. When the count value is less than 117, step S50 follows. When the count value is equal to or larger than 117, step S36 follows.

In step S50, the data (information data and its CRCC) is sequentially read out from the data memory 32 for every line.

In step S51, errors of the information data are detected by the read-out CRCC. When there is an error, the CRC flag is set to "1".

In step S52, a check is made to see if the read-out information data has error data or not by discriminating whether the CRC flag has been set to "1" or not.

When the CRC flag is equal to "1", step S53 follows. When the CRC flag is not equal to "1", step S54 follows.

In step S53, the line interpolation is executed by the interpolation circuit 40 and step S54 follows.

In step S54, the information data from the interpolation circuit 40 is output through the output terminal 42.

In step S55, a check is made to see if the reading operation of the data of one track has been finished or not. If NO, the processing routine is returned to step S50. If YES, the processing flow is finished.

Figure 13:
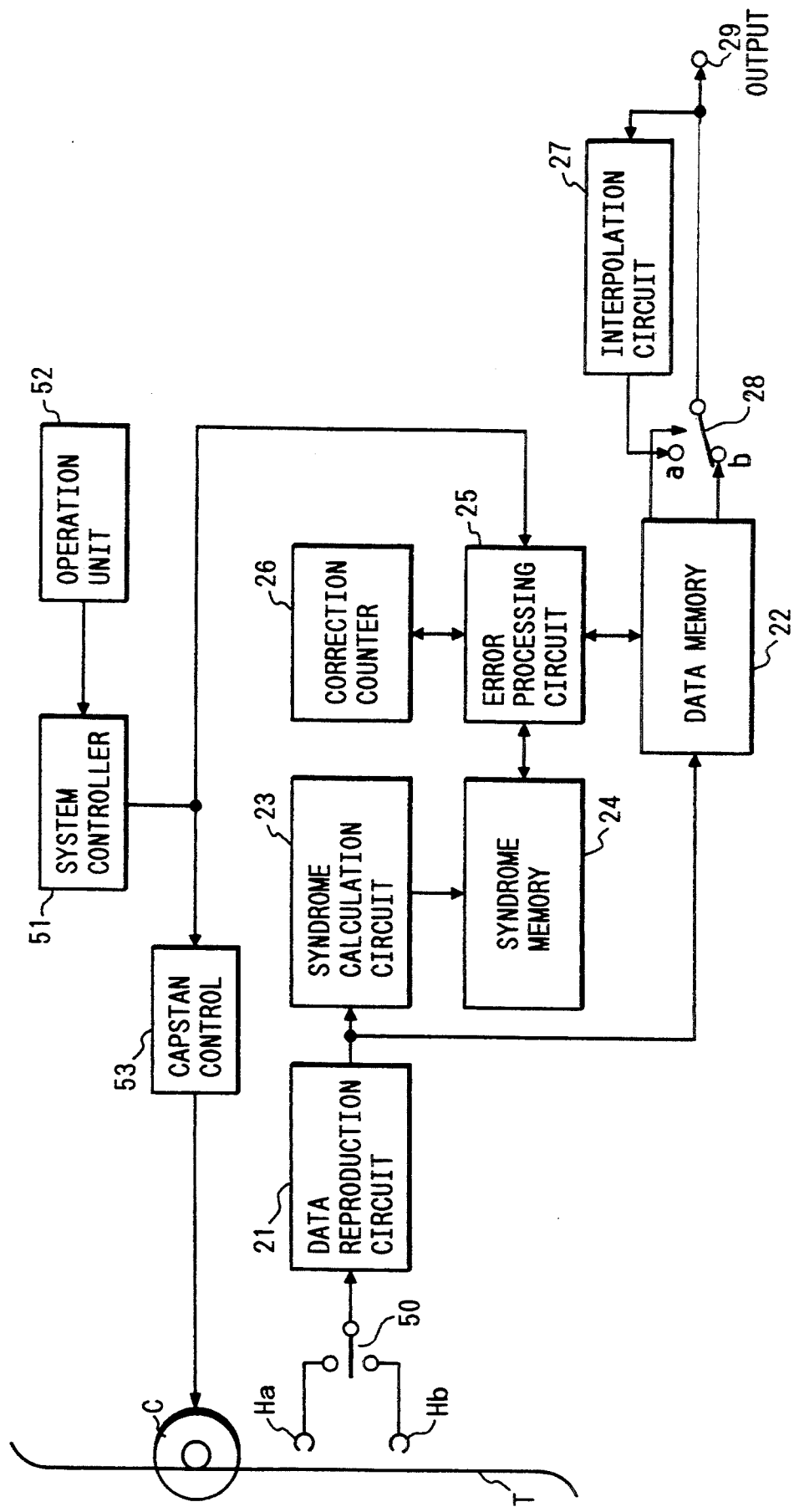
FIG. 13 is a block diagram of a data processing apparatus of a third embodiment according to the present invention.

FIG. 13 is a block diagram showing a construction of a data processing apparatus according to the third embodiment of the invention. The same component elements as those shown in FIG. 8 are designated by the same reference numerals and their detailed descriptions are omitted here.

In the third embodiment, the invention is applied to a digital VTR in which the transmission path is based on the magnetic recording and reproducing system.

In FIG. 13, T denotes a magnetic tape; $H_a$ and $H_b$ indicate rotary magnetic heads The rotary heads $H_a$ and $H_b$ alternately trace on the magnetic tape T and alternately generate reproduction signals.

A switch 50 selectively transfers the output signals of the heads $H_a$ and $H_b$ and supplies the selected signal as reproduction data (code train) to the data reproduction circuit 21.

The VTR of the embodiment has a normal reproducing mode in which the magnetic tape T is run at the same speed as that in the recording mode, and a special reproducing mode in which the magnetic tape T is run at a speed different from that in the recording mode.

A proper one of the reproducing modes is designated by the operator by operating an operation unit 52. In accordance with an instruction from the operation unit 52, a system controller 51 generates a mode setting signal and controls each section of the apparatus.

That is, the system controller 51 supplies the mode setting signal to a capstan control circuit 53 and controls a capstan C. In the normal reproducing mode, the magnetic tape T is run at the same speed as that in the recording mode. In the special reproducing mode, the magnetic tape T is run at a desired speed different from that in the recording mode.

The system controller 51 supplies the mode setting signal to the error processing circuit 25. In the normal reproducing mode, the error processing circuit 25 sets a threshold value in step S35 in FIG. 9 to the value 117. In the special reproducing mode (slow reproduction), the threshold value is set to a value (for example, 125) larger than 117.

The reason why the threshold value is set to a large value is because there is a surplus time in the slow reproducing mode as compared with the case in the normal reproducing mode.

Almost all of the error processing operations are substantially the same as those described above except that the threshold value in step S35 in FIG. 9 is changed in accordance with the reproducing mode.

Figure 14:
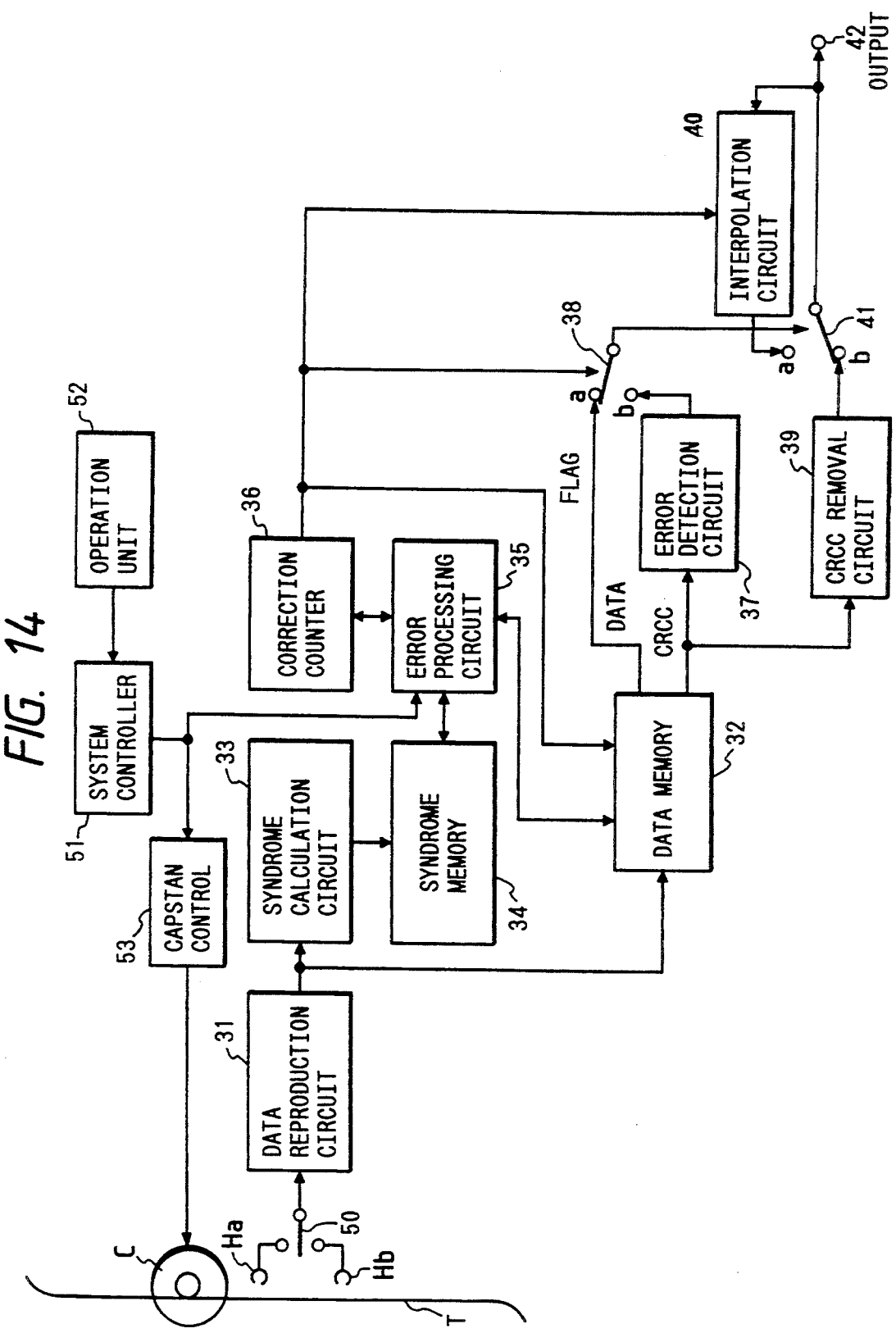
FIG. 14 is a block diagram of a data processing apparatus of a fourth embodiment according to the present invention.

FIG. 14 is a block diagram showing a construction of a data processing apparatus according to the fourth embodiment of the invention. The same component elements as those shown in FIGS. 10 and 13 are designated by the same reference numerals and their descriptions are omitted here.

Almost all of the error processing operations in the fourth embodiment are substantially the same as those described above except that the threshold value in step S35 in FIG. 12 is changed in accordance with the reproducing mode in a manner similar to the third embodiment.

Figure 15:
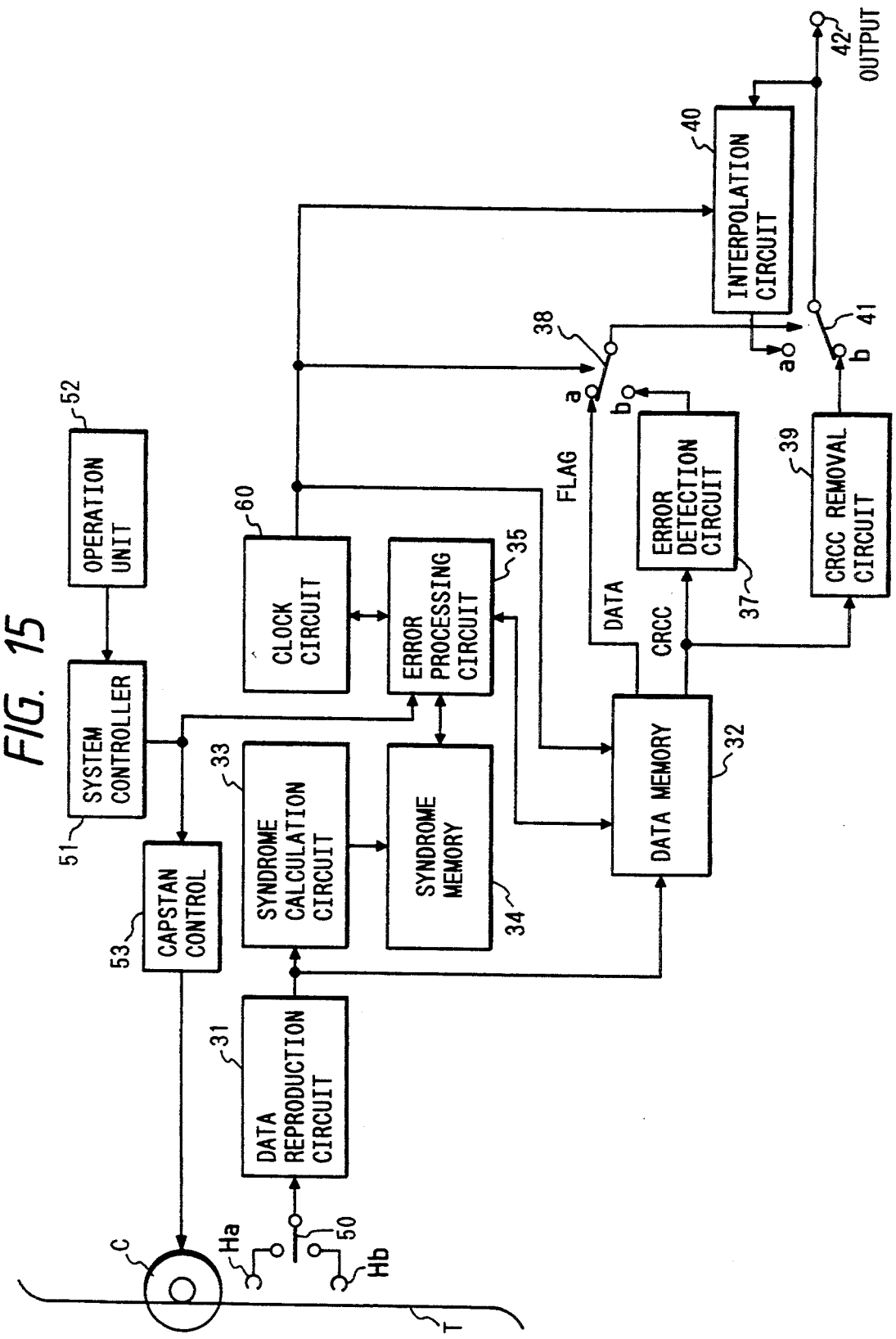
FIG. 15 is a block diagram of a data processing apparatus of a fifth embodiment according to the present invention.

FIG. 15 is a block diagram showing a construction of a data processing apparatus according to the fifth embodiment of the invention. The same component elements as those shown in FIG. 14 are designated by the same reference numerals and their descriptions are omitted here. Reference numeral 60 denotes a timer to count the error correction processing time of the error processing circuit. The timer 60 is reset every track.

In the fourth embodiment, the error correcting capability has been forced to deteriorate to the capability of one-error correction in accordance with the number of two-error correction processing times. The fifth embodiment is substantially the same as the fourth embodiment except that the time to execute the correcting process of the error code is measured and the above switching operation is executed in accordance with the measured time.

In the fifth embodiment, the time which can be allocated to the error correcting process has been predetermined and when the error correcting process of one track is not finished even if the processing time exceeds the predetermined time, only the one-error correction is executed for the error codes after the elapse of the predetermined time, while the interpolating process similar to that in the fourth embodiment is executed with respect to the correction of two or more errors.

As will be easily understood from the above description, according to the embodiment, transmission errors can be detected by the error detection due to the parity check and by the error detection code due to the CRCC. An easier interpolating method is used for the transmission errors of a predetermined number or more. Therefore, even when a number of transmission errors occur, the information data of a high quality can be output within a predetermined time.

The invention, accordingly, is very effective for the reproducing process of a moving image of, for example, a digital VTR or the like.

Many other variations and modifications of the present invention are possible without departing from the spirit and features of the present invention.

For example, although the above embodiments have been described with respect to the example of an error correction code which can execute the one-error detection and two-error correction, the invention is not limited to such an example. The switching operation of the processes in the error processing circuits 25 and 35 is also not limited to the switching from the two-error correcting process to the one-error correcting process. For example, the process can be also switched from the three-error correcting process to the two-error correcting process.

Although the embodiments have been limited to only the error correction of the outer code (when the two-error correction is executed a predetermined number of times or more, the two-error correcting process is inhibited), the error correcting operation of the inner code can be also limited.

In other words, the foregoing description of the embodiments has been given for illustrative purposes only and not to be construed as imposing limitations in any respect.

The scope of the invention is, therefore, to be determined solely by the following claims and is not limited by the text of the specification and alterations made within a scope equivalent to the scope of the claims falling within the true spirit and scope of the invention.

What is claimed is:

1. A data processing apparatus comprising:
    a) input means for inputting a code train including a plurality of parity codes each of which is composed of a plurality of data through a transmission path;
    b) error processing means for correcting error codes by using the parity codes in the code train supplied from said input means;
    c) counting means for counting the number of correction processes executed by said error processing means; and
    d) selecting means for selecting an error correction mode of said error processing means among a plurality of modes including first and second modes having different error correcting capabilities in accordance with an output of said counting means.

2. An apparatus according to claim 1, wherein the error correcting capability of the first mode is higher than that of the second mode,
    and in the case where a count value of said counting means is equal to or larger than a predetermined value, said selecting means can select the second mode, and when the count value of said counting means is less than the predetermined value, the selecting means can select the first mode.

3. An apparatus according to claim 1, wherein said error processing means suppresses an inherent error correcting capability of the parity codes in the second mode.

4. An apparatus according to claim 1, wherein said error processing means has a computing circuit to compute a plurality of syndromes of said parity code and detects the presence or absence of code errors by said syndromes.

5. An apparatus according to claim 1, wherein said error processing means sets a concealment flag to "1" for the error codes when the error correcting process cannot be performed.

6. An apparatus according to claim 5, further comprising interpolating means for forming interpolation codes in place of said error code, and
    wherein said interpolating means replaces the error codes to the interpolation codes in accordance with said concealment flag.

7. An apparatus according to claim 1, wherein said counting means is reset for every predetermined period of time.

8. An apparatus according to claim 1, wherein an operation of said selecting means is reset for every predetermined period of time.

9. An apparatus according to claim 1, wherein said input means includes a reproducing head for reproducing the code train from a number of helical tracks formed on a tape-shaped recording medium.

10. An apparatus according to claim 9, further having conveying means for conveying said tape-shaped recording medium, and
    wherein said conveying means can set a plurality of conveying speeds of the tape-shaped recording medium, and said selecting means is controlled in accordance with the conveying speed set by said conveying means.

11. A data processing apparatus comprising:
    a) input means for inputting a code train including a plurality of error correction codes each of which is composed of a plurality of data through a transmission path;
    b) error processing means for correcting error codes by using the error correction code in the code train input from said input means;
    c) counting means for counting the number of correction processes executed by said error processing means;
    d) interpolating means for forming interpolation codes to conceal the error codes which are incorrectable in said error processing means; and
    e) control means for switching an interpolation process of said interpolating means in accordance with an output of said counting means.

12. An apparatus according to claim 11, wherein the interpolation process of said interpolation means is switched between a process in which error codes of one sample are replaced as a unit and a process in which error codes of a predetermined number of samples are replaced as a unit.

13. An apparatus according to claim 11, wherein said error processing means has a computing circuit to compute a plurality of syndromes of the error correction code and detects the presence or absence of the code errors by said syndrome.

14. An apparatus according to claim 11, wherein said input means includes a reproducing head to reproduce the code train from a number of helical tracks formed on a tape-shaped recording medium.

15. An apparatus according to claim 11, wherein said error processing means clips the correcting process of the error code in accordance with the output of said counting means.

16. An apparatus according to claim 15, wherein said error processing means sets a concealment flag to "1" for the error codes when the error correcting process by the error correction code cannot be performed.

17. An apparatus according to claim 16, wherein said interpolating means conceals the error codes in accordance with said concealment flag.

18. A data processing apparatus comprising:
    a) input means for inputting through a transmission path a code train including a plurality of first error detection codes and a plurality of second error detection codes each of which is constructed by a plurality of codes;
    b) first detecting means for detecting error codes in the code train by using the first error detection codes in the code train supplied from said input means;
    c) second detecting means for detecting error codes in the code train by using the second error detection codes in the code train supplied from said input means;
    d) error processing means for correcting the error codes detected by the first detecting means;
    e) counting means for counting the number of correction processes executed by said error processing means; and
    f) selecting means for selecting one of outputs of the first and second error detecting means, in accordance with an output of the counting means.

19. An apparatus according to claim 18, wherein said error processing means has a plurality of error correction operating modes including first and second modes having different error correcting capabilities and selects either one of said plurality of modes in accordance with the output of said counting means.

20. An apparatus according to claim 19, wherein the error correcting capability of the first mode is higher than that of the second mode, and
when the count value of the counting means is equal to or larger than a predetermined value, said error processing means can select the second mode, and when said count value of the counting means is less than the predetermined value, the first mode can be selected.

21. An apparatus according to claim 18, wherein said first error detection code includes a parity code and said second error detection code includes a CRC code.

22. An apparatus according to claim 18, further including interpolating means for concealing the error codes.

23. An apparatus according to claim 22, wherein said interpolating means is able to conceal error codes which are uncorrectable in said error processing means and error codes detected by said second error detection code.

24. An apparatus according to claim 23, wherein said interpolating means switches an interpolation process thereof in accordance with the output of the counting means.

25. An apparatus according to claim 24, wherein said interpolating means selectively performs a process in which error codes of one sample are replaced as a unit and a process in which error codes of a plurality of samples are replaced as a unit.

26. An apparatus according to claim 18, wherein said input means includes a reproducing head to reproduce the code train from a number of helical tracks formed on a tape-shaped recording medium.

27. A data processing apparatus comprising:
a) input means for inputting through a transmission path a code train including a plurality of parity codes each of which is composed of a plurality of codes;
b) error processing means for correcting error codes by using the parity codes in the code train supplied from said input means;
c) measuring means for measuring time of a predetermined error correction processing for a predetermined amount of codes practically executed by said error processing means; and
d) selecting means for selecting an error correction mode of said error processing means in accordance with an output of said measuring means among a plurality of modes including first and second modes having different error correcting capabilities.

28. An apparatus according to claim 27, wherein the error correcting capability of the first mode is higher than that of the second mode, and
in the case where the count value of said counting means is equal to or larger than a predetermined value, said selecting means can select the second mode, and when the count value of the counting means is less than the predetermined value, the selecting means can select the first mode.

29. An apparatus according to claim 27, wherein said error processing means suppresses an inherent error correcting capability of the parity codes in the second mode.

30. An apparatus according to claim 3, wherein a unit of the parity codes inherently have an error correcting capability correcting two error codes, and wherein said error processing means corrects only one error code by using the unit of parity codes in the second mode and corrects two error codes by using the unit of parity codes in the first mode.

31. An apparatus according to claim 29, wherein a unit of the parity codes inherently have an error correcting capability correcting two error codes, and wherein said error processing means corrects only one error code by using the unit of parity codes in the second mode and corrects two error codes by using the unit of parity codes in the first mode.

32. A data processing device comprising:
(a) error correcting means for correcting error codes in a code train transmitted through a transmission path;
(b) discriminating means for discriminating whether or not a predetermined error correcting process for a predetermined amount of codes in the code train is able to be performed in a predetermined period of time by said error correcting means; and
(c) suppressing means for suppressing an error correcting capability of said error correcting means in response to an output of said discriminating means.

33. A device according to claim 32, wherein said error correcting means inherently has an error correcting capability correcting two error codes in a predetermined number of codes, and said suppressing means suppresses the error correcting capability so that only one code in the predetermined number of codes is correctable.

34. A data processing device, comprising:
(a) error correcting means for correcting error codes in a code train transmitted through a transmission path;
(b) discriminating means for discriminating whether or not a predetermined error correcting process for a predetermined amount of codes in the code train is able to be performed in a predetermined period of time by said error correcting means; and
(c) error concealing means for concealing error codes, an operation of said error concealing means being controlled in accordance with an output of said discriminating means.

35. A device according to claim 34, wherein said error concealing means changes a number of codes to be concealed as a unit.

* * * * *

UNITED STATES PATENT AND TRADEMARK OFFICE
CERTIFICATE OF CORRECTION

PATENT NO. : 5,436,917
DATED : July 25, 1995
INVENTOR(S) : KATSUMI KARASAWA

It is certified that error appears in the above-identified patent and that said Letters Patent is hereby corrected as shown below:

COLUMN 1

Line 49, "code" should read --codes--.

COLUMN 3

Line 35, "two-correcting processes" should read --a two-correcting process--.

COLUMN 6

Line 33, "increased." should read --(increased).--.
    Line 47, "increased." should read --(increased).--.
    Line 54, "increased" should read --(increased)--.

COLUMN 7

Line 35, "memory 32," should read --memory 22,--.

COLUMN 8

Line 52, "memory 12" should read --memory 22--.

COLUMN 11

Line 42, "lacks," should read --is lacking--.

COLUMN 12

Line 36, "circuit 47" should read --circuit 39--.

COLUMN 13

Line 28, "heads The" should read --heads. The--.

UNITED STATES PATENT AND TRADEMARK OFFICE
CERTIFICATE OF CORRECTION

PATENT NO. : 5,436,917
DATED : July 25, 1995
INVENTOR(S) : KATSUMI KARASAWA

It is certified that error appears in the above-identified patent and that said Letters Patent is hereby corrected as shown below:

COLUMN 14

Line 54, "detec-" should read --correc- --.

COLUMN 15

Line 3, "not" should read --is not--.
    Line 50, "code," should read --codes,--.

COLUMN 16

Line 31, "syndrome." should read --syndromes.--.

Signed and Sealed this

Twentieth Day of February, 1996

Attest:

BRUCE LEHMAN

*Attesting Officer*     *Commissioner of Patents and Trademarks*